United States Patent [19]

Shyr

[11] Patent Number: 4,904,610

[45] Date of Patent: Feb. 27, 1990

[54] WAFER LEVEL PROCESS FOR FABRICATING PASSIVATED SEMICONDUCTOR DEVICES

[75] Inventor: Richard Shyr, Greenlawn, N.Y.

[73] Assignee: General Instrument Corporation, New York, N.Y.

[21] Appl. No.: 143,916

[22] Filed: Jan. 27, 1988

[51] Int. Cl.[4] ............... H01L 21/78; H01L 21/80
[52] U.S. Cl. ............................ 437/15; 437/227; 437/209; 437/211
[58] Field of Search ............... 437/226, 227, 209, 211, 437/245, 8, 15; 156/644, 645, 646; 148/DIG. 28

[56] References Cited

U.S. PATENT DOCUMENTS

| | | | |
|---|---|---|---|
| 3,689,993 | 9/1972 | Tolar | 29/583 |
| 3,756,872 | 9/1973 | Goodman | 437/227 |
| 3,860,448 | 1/1975 | Konantz et al. | 437/227 |
| 3,891,483 | 6/1975 | Messerschmidt et al. | 156/3 |
| 3,913,217 | 10/1975 | Misawa et al. | 437/189 |
| 4,075,049 | 2/1978 | Wood | 156/220 |
| 4,224,101 | 9/1980 | Tijburg et al. | 156/643 |
| 4,623,693 | 11/1986 | Inoue et al. | 524/700 |
| 4,740,477 | 4/1988 | Einthoven et al. | 437/8 |

FOREIGN PATENT DOCUMENTS

| | | | |
|---|---|---|---|
| 55-75236 | 6/1980 | Japan | 437/226 |
| 55-107235 | 8/1980 | Japan | 437/226 |
| 55-124244 | 9/1980 | Japan | 437/227 |
| 56-167351 | 12/1981 | Japan | 437/226 |
| 57-58332 | 4/1982 | Japan | 437/226 |
| 57-59349 | 4/1982 | Japan | 437/227 |
| 57-60844 | 4/1982 | Japan | 437/227 |
| 57-92845 | 6/1982 | Japan | 437/8 |
| 58-196031 | 11/1983 | Japan | 437/227 |
| 61-81650 | 4/1986 | Japan | 437/226 |

Primary Examiner—Olik Chaudhuri
Attorney, Agent, or Firm—Barry R. Lipsitz

[57] ABSTRACT

A process for fabricating a multiplicity of semiconductor devices comprises the steps of applying electrodes to both faces of a semiconductor wafer, the mounting the semiconductor wafer to a substrate by means of an intervening layer of wax which bonds to the substrate and to the wafer. The wafer is then divided by grooves which extend through the wafer and at least partially through the layer of wax. The grooves are filled with a flexible resin that bonds to and passivates the edges of the chips, and the resin is subsequently cured. Next, the wax is removed from the cured resin and chips to provide a discrete flexible unit separate from the substrate. The discrete unit is divided into cells, each of which includes one of the chips for subsequent fabrication into a completed semiconductor device.

43 Claims, 3 Drawing Sheets

WAFER LEVEL PROCESS FOR FABRICATING PASSIVATED SEMICONDUCTOR DEVICES

BACKGROUND OF THE INVENTION

The invention relates generally to processes for fabricating semiconductor devices, and deals more particularly with low cost processes for fabricating rectifiers and other low and high voltage semiconductor devices.

The following process was previously known to fabricate semiconductor rectifiers:

First, a silcon wafer is doped by diffusion to provide a p-n layer suitable for the intended application.

Second, the wafer is cut or sandblasted to provide individual "chips", also known in the art as "dice". Each of the chips contains a portion of the p-n layer forming a small p-n junction. The cutting operation may be performed by a disc saw having a diamond blade which is adapted to cut approximately two-thirds the way through the thickness of the wafer. Then, the wafer is fractured along the lines of cut into the individual chips. The sandblasting operation may begin by using wax to bond stainless steel resist elements in the shape of the desired silicon chips onto the surface of the wafer. Then a blast of sand wears channels through the wafer around the edges of the resist elements to divide the wafer into the desired chips. Both the fracturing step of the saw cut operation and the sandblast step of the sandblasting operation leave the edges of the silicon chips rough.

Third, silver-plated copper discs are soldered with silver solder onto the opposite faces of the individual silicon chips to provide electrodes.

Fourth, the electroded chips are subject to a chemical etching process to smooth the sides of the chips which were made rough by either the cutting or sandblasting operations. In the chemical etch step, the individual, electroded silicon chips are loaded into a beaker containing a mixture of hydrofluoric acid, nitric acid, and acetic acid, and the beaker is agitated. Then the electroded chips are rinsed in hydrogen peroxide, and later subject to additional chemical baths and rinses of the same types.

Fifth, each individual electroded chip is inserted into an individual mold, and a silicon resin, such as Silastic (trademark of Dow Chemical) resin, is poured into the mold around the sides of the electroded chip to passivate the exposed edges of the silicon chip.

Sixth, the resin is cured by heat.

There are several problems with the foregoing process. During the third through sixth steps, the silicon chips or electroded chips, as the case may be, are separate small pieces which must be handled individually. This is cumbersome and expensive, particularly during the fifth step when each of the chips is individually inserted into a mold. Also, there are frequently errors in the handling such that the polarity of the cells is reversed, and corresponding errors result in the subsequent utilization of the chip. Moreover, it is cumbersome to electrically test the chips because they are separated from each other and must be handled individually.

Further, the chemical etching steps of the foregoing prior art process require multiple baths, resulting in silver contamination from the electrodes and the solder onto the silicon chip. While the contamination is less severe than would be the case if the electrodes were not silver plated, such silver contamination degrades the reverse leakage current and high temperature performance of the finished product. Also, the requirement for a silver plate on each copper electrode is expensive.

Accordingly, a general object of the present invention is to provide a low cost method for fabricating passivated semiconductor devices such as rectifiers.

A more specific object of the present invention is to provide a process which does not require individual handling of a batch of silicon chips used to make the semiconductor devices.

Another specific object of the present invention is to provide processes which do not require silver plated electrode discs.

Still another specific object of the present invention is to provide processes which avoid metal contamination of the silicon chips.

Yet another specific object of the present invention is to provide processes which are adapted to the production of transistors, thyristors, MOSFETS and other high voltage semiconductor devices.

Yet another specific object of the present invention is to provide a batch of electroded silicon chips in a form convenient for electrical testing.

SUMMARY OF THE INVENTION

The invention resides in a process for fabricating a plurality of semiconductor devices. The process comprises the steps of mounting a semiconductor wafer on a substrate, dividing the mounted semiconductor wafer into a plurality of chips such that there are spaces between the chips, and filling the spaces between the chips with a flexible substance which firmly bonds to and passivates the edges of the chips. In accordance with this process, passivation advantageously occurs at the wafer level. Further, junction etching of individual chips can be replaced by dividing the wafer into chips by mechanical grooving or the like which produces a beveled (i.e., V-groove) space between adjacent chips, and then chemically etching the chips while still in wafer shape. Then, the spaces are filled by the flexible bonding and passivating substance.

According to other features of the invention, the process further comprises the subsequent steps of separating the flexibly bonded chips from the substrate, applying solder to the chips as a unit, and separating the chips from each other while retaining a layer of the flexible bonding and passivating substance on the edges of the chips.

The mounting step may comprise the step of bonding the wafer to the substrate by an intervening layer of wax, which wax is melted or chemically dissolved during the step of separating the substrate from the flexibly bonded chips. The grooves which separate the chips also extend into the wax. By the foregoing process, the silicon chips are handled as a group until the step of separating the chips from each other, and this group handling is relatively simple and inexpensive compared to the handling involved in the prior ar process. Also, because the chips are bonded together by the substance, errors in polarity are avoided.

The invention also resides in a multiple chip structure formed during the process, which structure comprises a plurality of the semiconductor chips spaced from each other and arranged in a single layer, with a resin adapted to bond the chips to each other in the layer. The resin fills the spaces between the chips and passivates the edges of the chips. This structure provides a convenient form in which to handle and test the electrical properties of the chips.

According to another embodiment of the invention, a process for fabricating a plurality of semiconductor devices comprises the steps of mounting a semiconductor wafer on a substrate, dividing the semiconductor wafer while mounted on the substrate into a plurality of chips such that there are spaces between the chips, and etching the edges of the chips while still mounted on the substrate. The etching may be provided by a combination of acids, and the wafer may be mounted to the substrate by an intervening layer of wax which is resistant to the acid.

DETAILED DESCRIPTION OF THE PREFERRED EMBODIMENT

Figure 1:
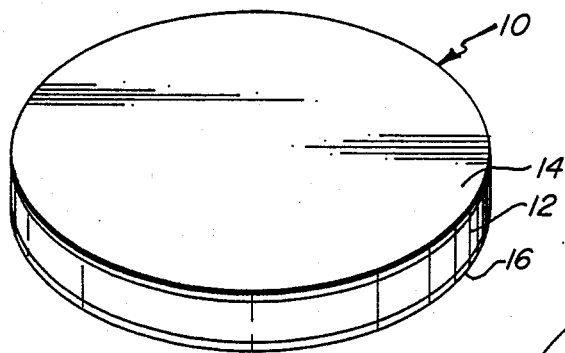
FIG. 1 is a perspective view of a wafer structure comprising an electrode plated silicon wafer utilized in a process according to one embodiment of the present invention to fabricate a multiplicity of semiconductor devices.

Turning now to the figures, FIG. 1 illustrates a structure generally designated 10 utilized in a process embodying the present invention. The structure 10 includes a silicon (or other type) wafer 12 which, by way of example, is doped by diffusion to provide a p-n layer. Both of the faces of the wafer 12 are plated to form electrodes 14 and 16. By way of example, the plating may be performed in a three-step operation. According to this example, first the faces of the silicon wafer are nickel plated in an electroless manner. Then, the nickel surface is gold plated in an electroless manner, and finally, the gold plate is further gold plated in an electrolytic manner. In the illustrated embodiment, the electrodes 14 and 16 cover the entire faces of the wafer 12.

Figure 2:
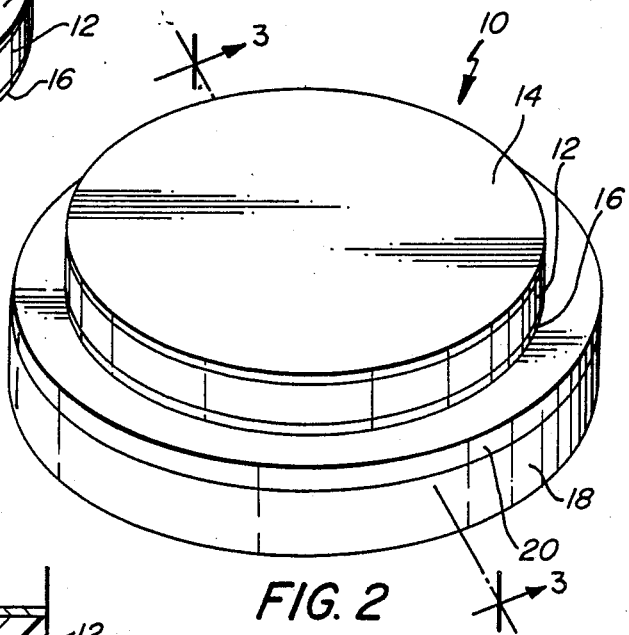
FIG. 2 is a perspective view of the structure of FIG. 1 mounted on a glass substrate.
Figure 3:
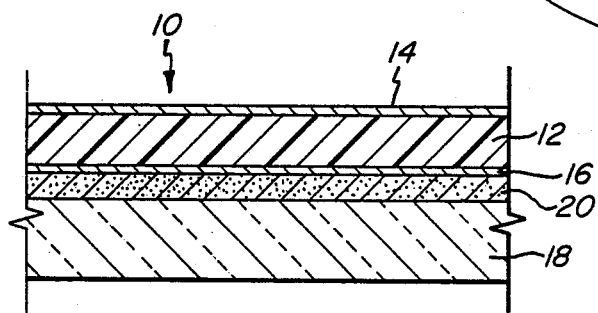
FIG. 3 is a partial cross-sectional view taken along the plane 3—3 of FIG. 2.

The next step according to the present invention and illustrated in FIGS. 2 and 3, is to bond the wafer 12 to a glass substrate 18 by means of an intervening layer 20 of adhesive such as wax. To accomplish this, the glass substrate may be held down by a vacuum chuck and heated to approximately 125° C. Then, wax in solid form is placed on the substrate, and the heat maintained until the wax melts. Next, the wafer is placed on top of the melted wax and pressed down until the wax layer is 1–10 mils. thick. Finally, the substrate, wax and wafer are cooled. It should be noted that the figures are not drawn to scale and, typically, the glass substrate is much thicker than the silicon wafer 12 which in turn is much thicker than the electrodes 14 and 16.

Figure 4:
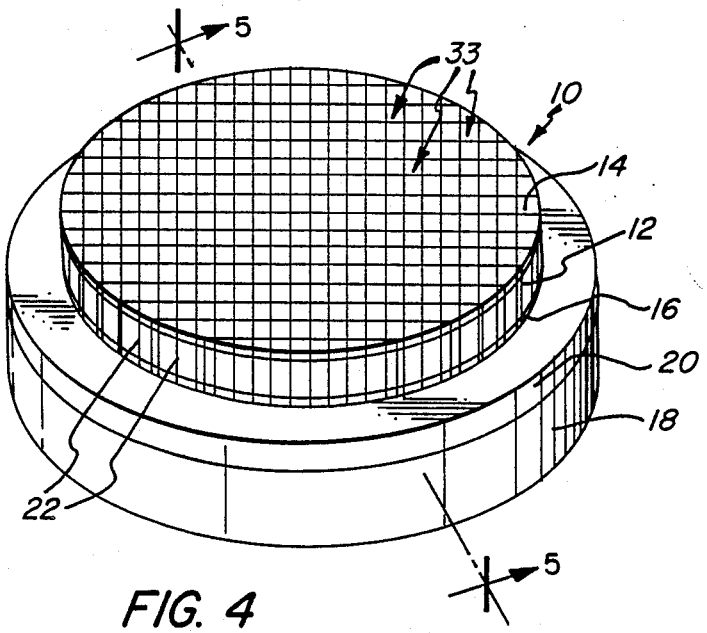
FIG. 4 is a perspective view of the structure of FIG. 2 after the wafer is grooved to define individual dice.
Figure 5:
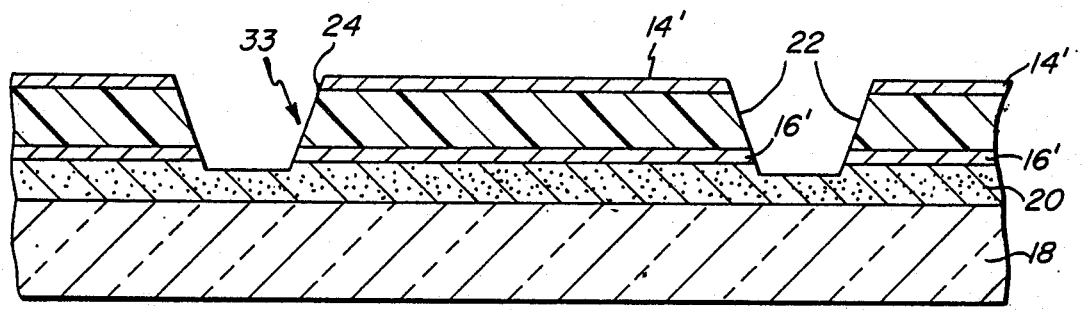
FIG. 5 is a partial cross-sectional view of the dice and substrate structure taken along the plane 5—5 of FIG. 4.

The next step in the process according to the invention, as illustrated in FIGS. 4 and 5, is to divide the structure 10 into cells 33 whereby the silicon wafer is divided into dice or chips 22, and the electrodes 14 and 16 are correspondingly divided into electrode portions 14' and 16' on the chips. The chips are sized for the desired application and include a portion of the p-n layer described above. In the illustrated embodiment, grooves 24 are mechanically cut by a disc saw having a diamond blade which cuts entirely through the electrodes 14 and 16 and the wafer 12, but only partially through the layer 20 of wax. The diamond blade has a profile resulting in a beveled groove yielding a high breakdown voltage for a rectifier or other end product.

When the grooves have been formed mechanically, the wafer/substrate structure shown in FIG. 4 is immersed in a chemical etching bath to smooth the sides of the silicon chips 22 which were made rough to a small degree during the mechanical cutting step. The chemical bath comprises a mixture of hydrofluoric, nitric and phosphoric acids in a ratio 4-8-3, respectively, and the immersion time is approximately 40 seconds. After this time, the cell composition is rinsed with de-ionized water and dried in air. It should be noted that this chemical etching step is much quicker and simpler than any corresponding chemical etching step required in prior art processes, for several reasons. First, the gold plate of the present invention is inert to the chemical mixture so that there is no need to provide several baths and rinses to clean the silicon chips. Also, there is no layer of solder at this step of the present process exhibiting voids which can trap the contaminated etching mixture. Further, the structure of FIG. 4 has fewer layers than the prior art, and the surface of the beveled edges are not as rough as in structures used in the prior art.

In another embodiment of the invention, the grooves are cut by a chemical etching process. By way of example, the chemical comprises either sodium hydroxide or ammonium hydroxide or ethylene diamene bases or other strong base heated between 80° C. and approximately the boiling point of the base. The chemical etching process requires suitable masks for the desired cell size, which masks may be comprised of individual electrodes on the wafer. Such electrodes are formed by providing an oxide layer on the top and bottom of the wafer 12. Then, apertures defining the desired cells are made in the oxide layers on one face of the wafer 12, and all oxide on the other face is removed. Next, the exposed portions of the wafer are plated with nickel, and then gold is plated over the nickel layer. Finally, the oxide is removed by buffered HF acid, and the wafer is etched to provide the grooves.

Figure 6:
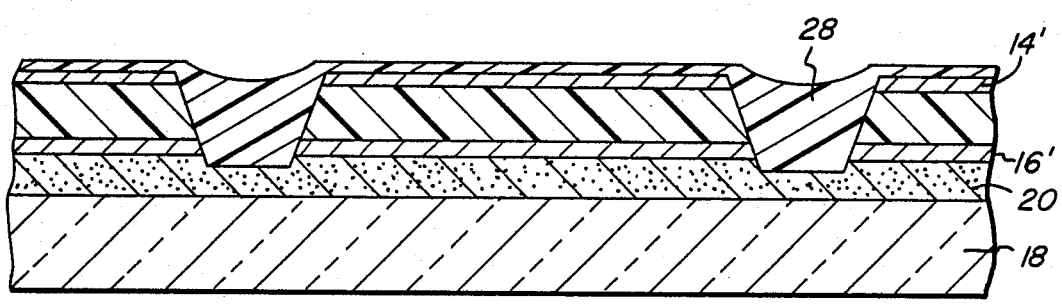
FIG. 6 is a partial cross-sectional view of the dice and substrate structure as in FIG. 5 after the grooves separating the dice are filled with a silicone resin.

After the formation of the grooves by either mechanical cutting or chemical etching means, an RTV silicone resin 28 is applied by a squeegee over the grooved wafer so that the resin fills the grooves 24 as illustrated in FIG. 6. The silicone resin also coats the electrode portions 14'. This application step may be performed at room temperature in a nitrogen atmosphere with less than 10% humidity. By way of example, the squeegee has 80 durometer hardness. The RTV silicone resin includes iron oxide and acetoxy-silane to provide an acetoxy curing mechanism, and is a type which can withstand a temperature of at least 350° C. and preferably at least 400° C. without losing its adhesion to the wafer 12 or otherwise breaking down. The high temperature property is provided by the iron oxide component of the resin. One suitable silicone rubber compound is part No. 7117-105 RTV produced by Dow Chemical, and another suitable resin bears the trademark Cemusil NG3830 and is manufactured by CHEMIEWERK of Nunchritz, East Germany.

After the silicone resin 28 is applied, it is cured for approximately 48 hours at room temperature using moisture as a catalyst. By way of example, the moisture catalyst is provided by 20% to 50% relative humidity. Such curing insures a good adhesion between the silicon resin and the silicone chips 22.

Figure 7:
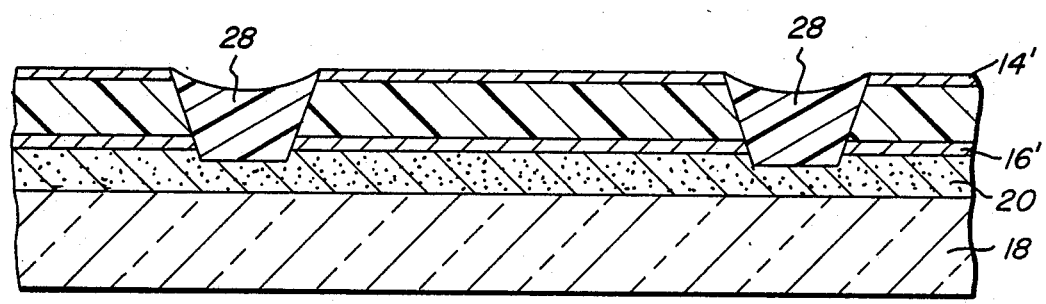
FIG. 7 is a cross-sectional view of the dice and substrate structure of FIG. 6 after the silicone resin coating the upper faces of the silicon dice has been removed.

Next, according to the present invention, the layer of silicone resin 28 adhering to the electrode portions 14' is removed. Such removal is easy because the silicone resin does not adhere well to the gold, and removal may be accomplished by a mechanical buffing operation such as by use of a simple rubber eraser. The result is illustrated in FIG. 7.

Figure 8:
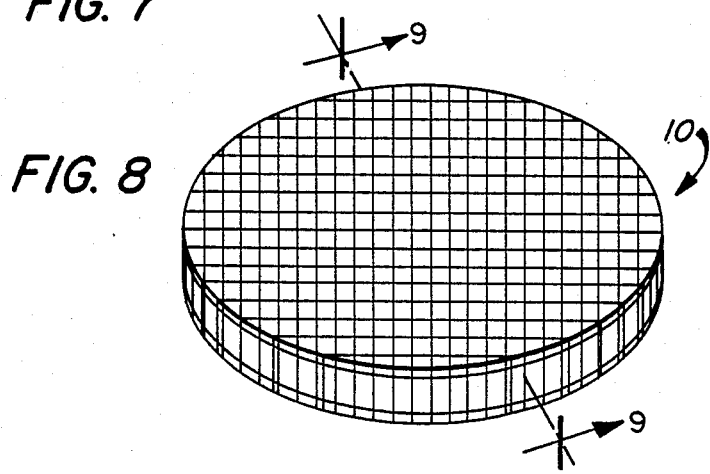
FIG. 8 is a perspective view of the dice structure of FIG. 7 after the substrate has been removed.
Figure 9:
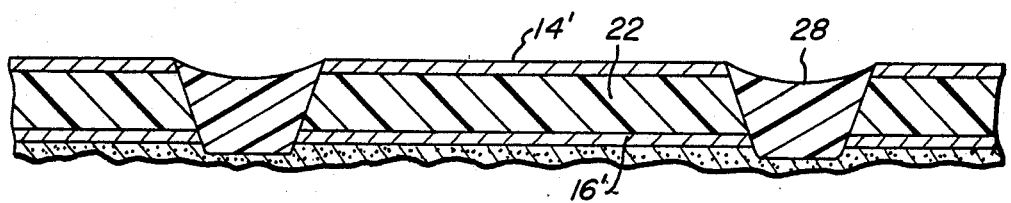
FIG. 9 is a partial cross-sectional view of the dice structure taken along the plane 9—9 of FIG. 8.
Figure 10:
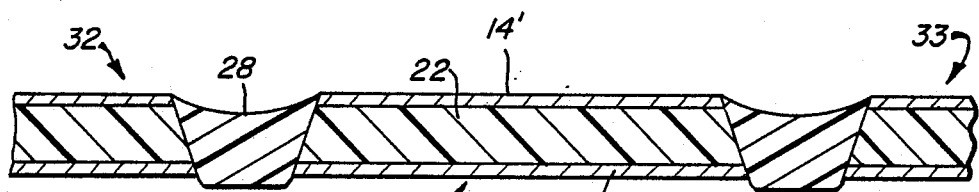
FIG. 10 is a cross-sectional view of the dice structure as in FIG. 9 after removal of a residual layer of wax coating the bottom of the dice.

The next step in the process of the invention is to remove the glass substrate 18 to form a flexible wafer structure as illustrated in FIGS. 8 and 9. In the preferred embodiment of the invention, the removal is accomplished by first heating the substrate 18, resin 28, wax layer 20, and wafer 12 to approximately 125° C. and then peeling the wafer 12 and resin 28 from the substrate 18. After removal of the glass substrate, the silicon chips 22 remain bonded to one another by the cured, flexible silicon resin 28. There is also a layer of residual wax adhering to the electrode portions 16' and the silicon resin 28, which wax is removed by dipping in a bath of boiling trichlorethylene in a ratio 1-1-1 to form the flexible wafer 32, as illustrated in FIG. 10. In an alternate embodiment of the invention, the glass substrate 18 and wax are removed by dipping the structure shown in FIG. 7 into a bath of trichlorethylene.

The flexible wafer 32 is in a convenient form to electrically test the cells 33 because the cells are in known locations relative to each other, exhibit the same polarity, and may be easily mounted onto a test plate. It should also be noted that because the silicon chips 22 are bonded together in the flexible wafer 32, they may be handled as a group to save time and money. It has been found that the adhesion between the silicone resin 28 and the edges of silicon chips 22 is extremely tenacious, and the flexible wafer 32 is therefore very durable.

Figure 11:
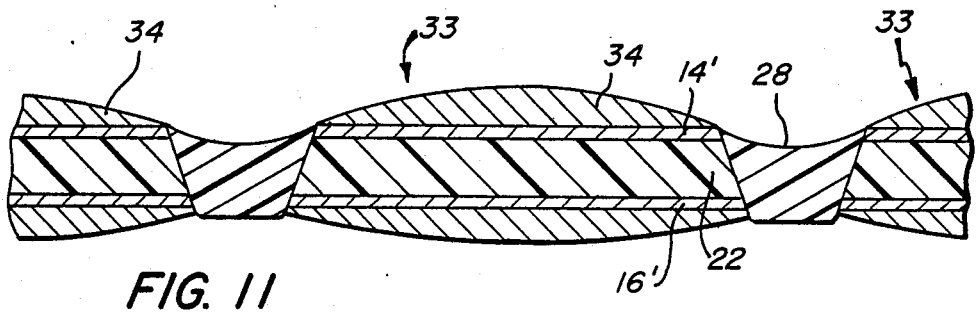
FIG. 11 is a cross-sectional view of the dice structure as in FIG. 10 after solder has been applied to the electrode portions of the silicon dice.

Next, according to the present invention, solder 34 is applied to the electrode portions 14' and 16' of each of the cells 33 as illustrated in FIG. 11. To accomplish this, the entire flexible wafer 32 may be dipped into a hot bath of liquid lead-tin, or lead-tin-silver solder at approximately 360° C. Alternately, lead-silver-indium may be pre-formed into disc shapes, and one such disc applied to each electrode portion 14' and 16' of the cells 33. Then, the flexible wafer 32 and discs are heated to approximately 360° C. such that the discs adhere to the electrode portions 14' and 16'. It should be noted that either of these steps is relatively simple compared to the prior art because in these steps all of the cells are joined together in the flexible wafer 32, and there is no need to orient and mount individual cells in preparation for the solder as required in prior art processes. It should also be noted that any change in size of the silicon chips 22 due to the heat of the solder bath is accommodated by the flexibility of the resin 28. Therefore, there is little danger of cracking the silicon chips 22 by thermal shock.

Figure 12:
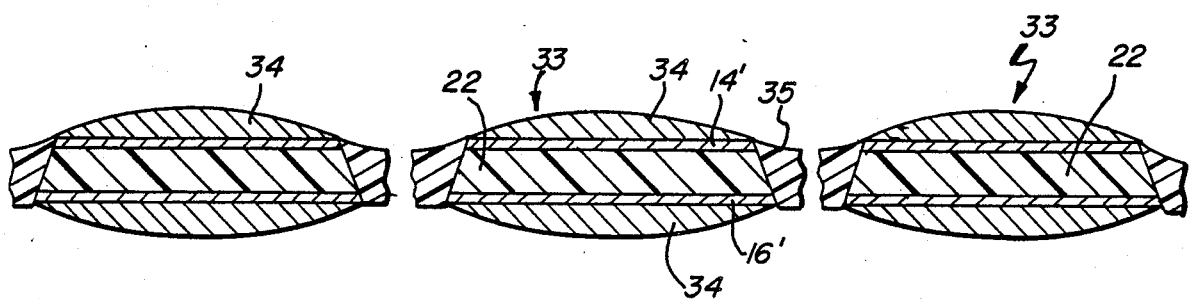
FIG. 12 is a cross-sectional view of the structure as in FIG. 11 after the individual dice have been separated from each other.

Next, according to the present invention, the flexible wafer 32 with the deposited solder 34 is mounted on an adhesive surface such as adhesive tape, and the cells are separated from each other in a dicing operation. The dicing operation may be provided by a laser beam, a multiplicity of ganged saw blades or by a mechanical tearing operation. It should be noted that pursuant to any of the dicing operations, a thin layer 35 of the silicone resin 28 is retained along the edges of the individual cells 33 to passivate the silicon chips 22, as illustrated in FIG. 12. Then, the diced cells are ready for assembly into rectifiers, a rectifier bridge or other component, depending on the design of the silicon chips 22 and the desired application.

As indicated by the foregoing steps, the wax 20 which is used to mount silicon wafer 12 to the glass substrate 18 must meet several requirements. It must adhere well to the gold electrode 16 to bond the silicon wafer 12 to the glass substrate 18. The bond must be strong enough so that the wafer 12 does not vibrate when the wafer is cut by the diamond saw into the silicon chips 22. The wax 20 must be chemically resistant to the etching acid which, in the illustrated embodiment, comprises a hydrofluoric—nitric—phosphoric acid bath. Also, the wax 20 must be capable of removal by a chemical such as trichlorethylene or other process which does not attack the RTV silicone 28. Finally, the wax 20 must be a type which does not itself attack the RTV silicone. To satisfy these requirements, the wax 20 may comprise a mixture of Vestowax A-235, a trademark of Durachem of Harrison, N.Y., and CW-210, a product of Corning Rubber Company of Brooklyn, N.Y. The Vestowax wax provides rigidity, acid resistance, and clean cuts, and the CW-210 wax provides strong adhesion to gold. Four parts of the Vestowax wax and one part of the CW-210 wax, melted at 90°–110° C., and then mechanically blended together has been found to provide an acceptable composition for wax 20.

By the foregoing, various processes and products embodying the present invention have been disclosed. However, numerous modifications and substitutions may be made without deviating from the scope of the invention. For example, a germanium wafer or a different type of silicon wafer may be substituted for the wafer 12 to provide a different type of semiconductor cell, such as wafers which form transistor, thyristor, MOSFET, and other semiconductor devices. Therefore, the invention has been disclosed by way of illustration and not limitation, and reference should be made to the following claims to determine the scope of the invention.

I claim:

1. A process for fabricating a plurality of semiconductor devices, said process comprising the steps of:
   mounting a semiconductor wafer on a substrate by an intervening layer of adhesive;
   cutting a multiplicity of grooves in the mounted wafer to form a plurality of chips, said grooves extending entirely through the wafer and partly through said layer of adhesive without extending into said substrate;

putting a resinous bonding and passivating substance into said grooves, said substance at least partially filling portions of said grooves in both the adhesive layer and the wafer, to passivate, bond to, and interconnect the chips; and curing said substance.

2. A process as set forth in claim 1 further comprising the steps of:

separating the substrate from the chips and said substance which bonds to the chips after the mounting, cutting, putting and curing steps whereby said chips and bonding substance form a discrete unit separate from said substrate; and after the separating step, applying heated solder to said plurality of chips and bonding substance while in said discrete unit at a temperature such that said bonding substance withstands the heat of said solder without losing its bond to the chips.

3. A process as set forth in claim 1 wherein the intervening layers of adhesive comprises wax.

4. A process as set forth in claim 1 wherein the cutting step comprises the step of cutting said grooves with a blade, and wherein said grooves are beveled such that sidewalls of the chips slope outwardly from a top, exposed surface of the chips.

5. A process as set forth in claim 1 wherein the cutting step comprises the step of chemically etching beveled grooves in said wafer.

6. A process as set forth in claim 1 wherein said substance which fills the spaces between the chips comprises a silicone resin which passivates the edges of said chips.

7. A process as set forth in claim 6 wherein said silicone resin is cured into a flexible state.

8. A process as set forth in claim 6 wherein said silicone resin is cured in a humid environment.

9. A process as set forth in claim 8 wherein said resin is cured in an environment having 20–50% relative humidity.

10. A process as set forth in claim 2 wherein said bonding substance comprises a silicone resin formulated to withstand heating to at least 350° C. without losing its bond to the chips.

11. A process as set forth in claim 10 wherein said silicone resin comprises iron oxide and acetoxysilane.

12. A process as set forth in claim 1 further comprising the step of electrode plating opposite faces of said wafer before the step of mounting said wafer onto said substrate, and wherein the cutting step includes the step of cutting the electrode plating into electrode portions which cover opposite faces of the chips.

13. A process as set forth in claim 12 wherein the step of putting said resinous substance into said grooves also includes the step of covering at least part of the exposed electrode portions on said chips with said substance.

14. A process as set forth in claim 13 wherein said substance is applied to the exposed electrode portions and put into the grooves by using a squeegee to draw the substance across the cut semiconductor wafer.

15. A process as set forth in claim 14 wherein the bonding substance comprises a silicone resin.

16. A process as set forth in claim 15 further comprising the step of removing the cured silicone resin from said electrode portions by a mechanical buffing operation.

17. A process as set forth in claim 16 wherein the removal step comprises the step of rubbing said cured silicone resin off said electrode portions using a rubber eraser.

18. A process as set forth in claim 1 further comprising the step of forming said wafer from silicon.

19. A process as set forth in claim 3 further comprising the steps of separating the substrate from the chips and said substance which bonds to the chips by melting away said wax using heat, and then chemically dissolving any wax remaining after the melting step.

20. A process as set forth in claim 19 wherein trichloroethylene is used to chemically dissolve said remaining wax.

21. A process as set forth in claim 1 further comprising the step of applying electrodes to the opposite faces of said wafer before the step of mounting said wafer on said substrate.

22. A process as set forth in claim 2 wherein said solder is applied by dipping said discrete unit of chips and bonding substance into a solder bath.

23. A process as set forth in claim 22 wherein said bonding substance comprises a silicone resin.

24. A process as set forth in claim 23 wherein said silicone resin is a type which can withstand heating to at least 350° C. by said solder bath without losing its adhesion to the chips.

25. A process as set forth in claim 2 further comprising the step of separating said chips from each other after the solder is applied while retaining a layer of the bonding substance on the edges of the chips.

26. A process as set forth in claim 25 wherein said bonding substance comprises a silicone resin.

27. A process as set forth in claim 2 further comprising the subsequent steps of placing said discrete unit with solder onto an adhesive surface and separating the chips from each other while retaining a layer of the bonding substance on the edges of the chips.

28. A process as set forth in claim 27 wherein the step of separating the chips from each other comprises the step of mechanically cutting through said bonding substance between the chips.

29. A process as set forth in claim 27 wherein the step of separating said chips from each other comprises the step of cutting the bonding substance between the chips with a laser beam.

30. A process as set forth in claim 1 further comprising the step of diffusing impurities into said wafer to form a p-n layer.

31. A process as set forth in claim 1 further comprising the step of etching the edges of the chips with an acid before the step of putting the resinous substance into the grooves between the chips and in the adhesive layer.

32. A process as set forth in claim 31 wherein said acid is a hydrofluoric-nitric-phosphoric acid mixture.

33. A process as set forth in claim 31 wherein the intervening adhesive layer comprises wax, and said wax is a type which is resistant to the acid used in the etching step and does not attack said substance which bonds to the chips.

34. A process as set forth in claim 33 wherein said substance which bonds to the chips is a silicone resin and said wax is a type which dissolves in trichlorethylene.

35. A process as set forth in claim 33 further comprising the step of separating the substrate from the chips and said substance which bonds to the chips by chemically dissolving said layer of wax.

36. A process as set forth in claim 35 wherein said layer of wax is chemically dissolved using trichlorethylene.

37. A process for fabricating a multiplicity of semiconductor devices, said process comprising the steps of:
applying electrodes to both faces of a semiconductor wafer;
mounting said semiconductor wafer on a substrate by means of an intervening layer of adhesive which bonds to the substrate and to the wafer;
dividing the wafer while mounted into a multiplicity of chips by forming grooves which extend through the wafer and partly through said layer of adhesive without extending into said substrate;
putting a resin into said grooves which passivates sidewalls of the chips, bonds to the sidewalls of said chips and interconnects said chips;
curing said resin;
separating said cured resin and chips from said substrate, whereby said chips and cured resin form a discrete unit separate from said substrate;
after the separating step, applying heated, melted solder to said chips and bonding substance while in said discrete unit at such a temperature that said cured resin withstands the heat of said solder; and
after the solder is applied, dividing said discrete unit with applied solder into cells, each cell including one of said chips and applied portion of the solder.

38. A process as set forth in claim 37 wherein said adhesive comprises wax and the separating step comprises the step of chemically dissolving the wax.

39. A process as set forth in claim 37 wherein the step of dividing said discrete unit into cells comprises the step of separating the chips from each other while retaining a layer of said cured resin around the edges of said chips to passivate the edges of said chips.

40. A process as set forth in claim 37 wherein the solder is applied by dipping said discrete unit in a solder bath.

41. A process as set forth in claim 37 comprising the further step of:
etching said grooves to smooth them prior to said putting step.

42. A process as set forth in claim 37 wherein said resin is a silicone resin.

43. A process as set forth in claim 37 wherein the wafer is divided by a bevel cut whereby the sidewalls of the chips slope outwardly from exposed top surfaces of the chips.

* * * * *